(12) United States Patent
Mikajiri et al.

(10) Patent No.: US 8,351,277 B2
(45) Date of Patent: Jan. 8, 2013

(54) METHOD FOR OPERATING SEMICONDUCTOR MEMORY DEVICE

(75) Inventors: Yoshimasa Mikajiri, Mie-ken (JP); Shigeto Oota, Mie-ken (JP); Masaru Kito, Kanagawa-ken (JP); Ryouhei Kirisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 13/039,557

(22) Filed: Mar. 3, 2011

(65) Prior Publication Data
US 2011/0216604 A1 Sep. 8, 2011

(30) Foreign Application Priority Data
Mar. 5, 2010 (JP) .................................. 2010-049415

(51) Int. Cl.
*G11C 16/04* (2006.01)
(52) U.S. Cl. .............................. 365/185.29; 365/185.3
(58) Field of Classification Search ............ 365/185.29, 365/185.3, 185.24
See application file for complete search history.

(56) References Cited

U.S. PATENT DOCUMENTS 8,199,573 B2 * 6/2012 Fukuzumi et al. ....... 365/185.05
2010/0207195 A1 8/2010 Fukuzumi et al.

FOREIGN PATENT DOCUMENTS

JP 2009-146954 7/2009

OTHER PUBLICATIONS

Office Action issued Aug. 31, 2012 in Korean Patent Application No. 10-2011-18930 (with English translation).

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a method is disclosed for operating a semiconductor memory device. The semiconductor memory device includes a substrate, a stacked body, a memory film, a channel body, a select transistor, and a wiring. The method can boost a potential of the channel body by applying a first erase potential to the wiring, the select gate, and the word electrode layer. In addition, after the boosting of the potential of the channel body, with the wiring and the select gate maintained at the first erase potential, the method can decrease a potential of the word electrode layer to a second erase potential lower than the first erase potential.

18 Claims, 6 Drawing Sheets

METHOD FOR OPERATING SEMICONDUCTOR MEMORY DEVICE

CROSS-REFERENCE TO RELATED APPLICATIONS

This application is based upon and claims the benefit of priority from Japanese Patent Application No. 2010-049415, filed on Mar. 5, 2010; the entire contents of which are incorporated herein by reference.

FIELD

Embodiments described herein relate generally to a method for operating a semiconductor memory device.

BACKGROUND

In conventional nonvolatile semiconductor memory devices (memories), device elements are integrated in a two-dimensional plane on a silicon substrate. To increase the storage capacity of a memory, the dimension of one element is reduced (miniaturized). However, such miniaturization has recently become difficult in terms of cost and technology.

In this context, a collectively processed three-dimensional stacked memory has been proposed. The collectively processed three-dimensional stacked memory includes a stacked body with insulating films and electrode films alternately stacked therein, silicon pillars piercing the stacked body, and a charge storage layer (memory layer) provided between the silicon pillar and the electrode film. Thus, a memory cell is provided at the intersection of the silicon pillar and each electrode film.

Furthermore, JP-A 2009-146954, for example, proposes a technique for three-dimensionally arranging memory cells. In this technique, memory holes are formed in a stacked body in which a plurality of word electrode layers each functioning as a control gate in a memory cell are alternately stacked with insulating layers. A charge storage film is formed on the inner wall of the memory hole. Then, silicon is provided in the memory hole. Furthermore, JP-A 2009-146954 discloses a data erasing method specific to such a three-dimensional stacked memory. This erasing method is based on the Gate Induced Drain Leakage (GIDL) current.

DETAILED DESCRIPTION

According to one embodiment, a method is disclosed for operating a semiconductor memory device. The semiconductor memory device includes a substrate, a stacked body, a memory film, a channel body, a select transistor, and a wiring.

The stacked body includes a plurality of word electrode layers and a plurality of insulating layers alternately stacked on the substrate.

The memory film includes a charge storage film provided on an inner wall of a memory hole punched through the stacked body.

The channel body is provided inside the memory film in the memory hole.

The select transistor includes a select gate stacked on the stacked body and is connected to an end portion of the channel body.

The wiring is connected to the select transistor.

The method can boost a potential of the channel body by applying a first erase potential to the wiring, the select gate, and the word electrode layer.

In addition, after the boosting of the potential of the channel body, with the wiring and the select gate maintained at the first erase potential, the method can decrease a potential of the word electrode layer to a second erase potential lower than the first erase potential.

Embodiments will now be described with reference to the drawings. In the following embodiments, silicon is taken as an example of the semiconductor. However, semiconductors other than silicon may also be used.

Figure 1:
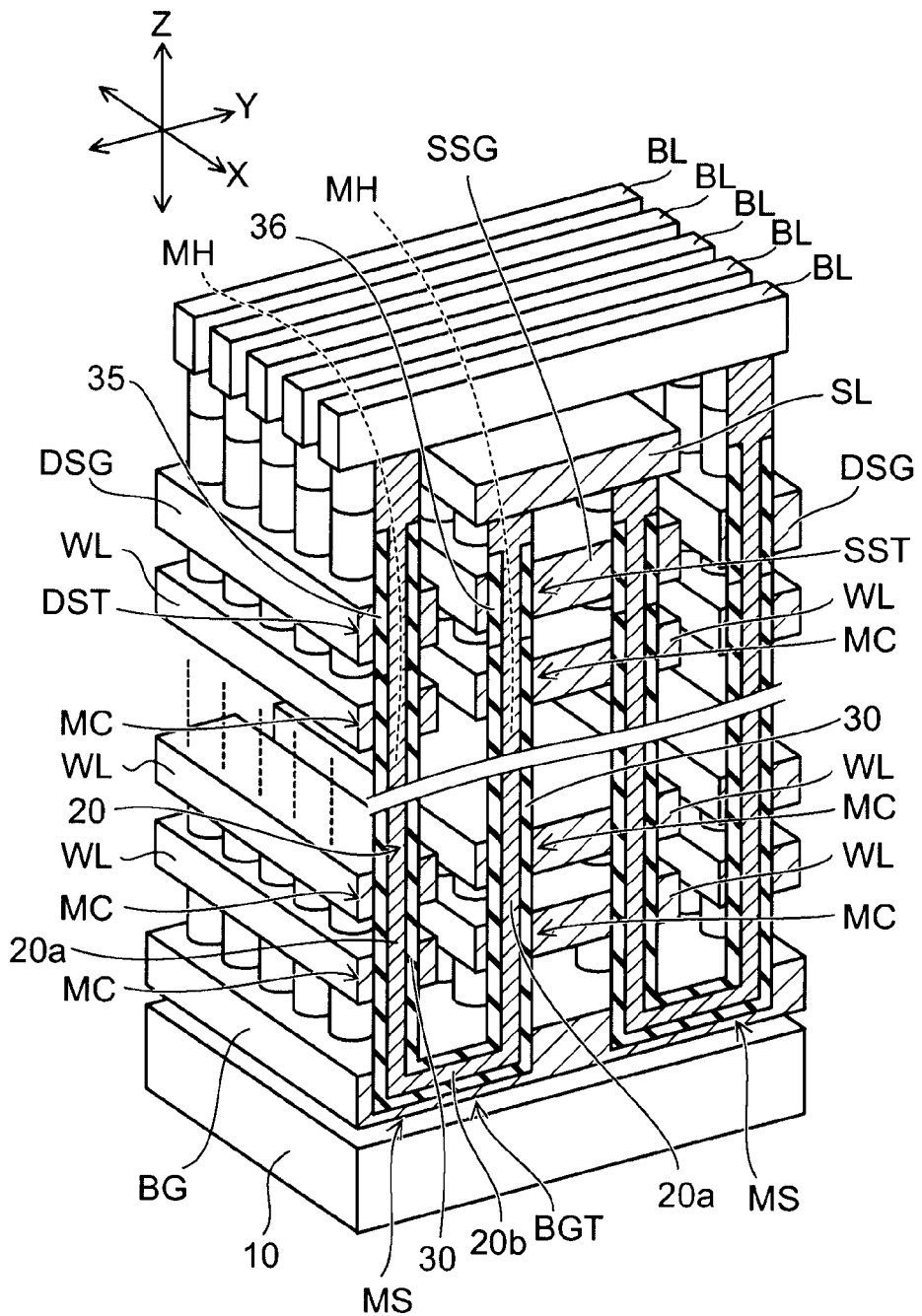
FIG. 1 is a schematic perspective view of a memory cell array in a semiconductor memory device of an embodiment.

FIG. 1 is a schematic perspective view of a memory cell array in a semiconductor memory device of an embodiment.

Figure 2:
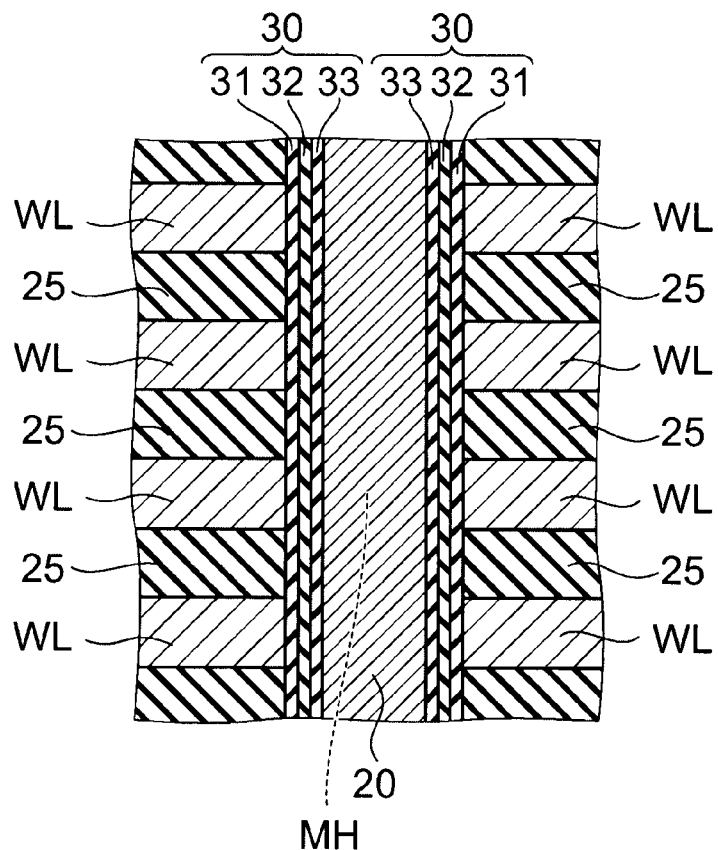
FIG. 2 is an enlarged cross-sectional view of the relevant part in FIG. 1.
Figure 3:
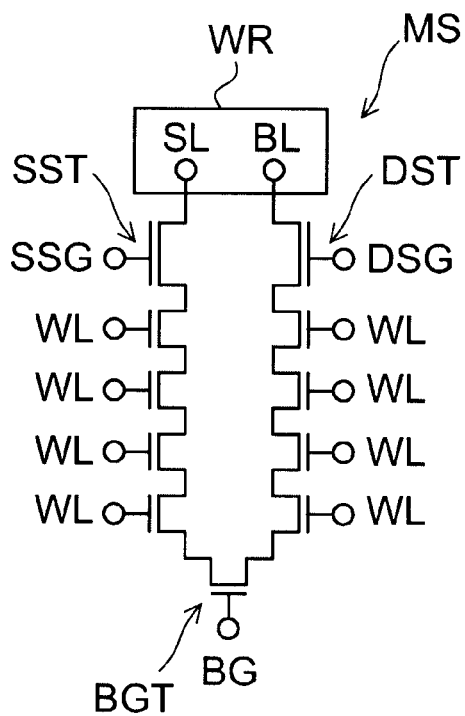
FIG. 3 is a circuit diagram of one memory string in the semiconductor memory device of the embodiment.

FIG. 2 is an enlarged cross-sectional view of the relevant part in FIG. 1. FIG. 3 is a circuit diagram of one memory string MS in the memory cell array.

In FIG. 1, for clarity of illustration, insulating portions except the insulating film formed in the memory hole MH are not shown.

In this specification, for convenience of description, an XYZ orthogonal coordinate system is introduced. In this coordinate system, two directions parallel to the major surface of the substrate 10 and orthogonal to each other are referred to as an X direction and a Y direction. The direction orthogonal to both the X direction and the Y direction is referred to as a Z direction. FIG. 1 corresponds to a cross section in the Y direction.

Above the substrate 10, a back gate BG is provided via an insulating layer, not shown. The back gate BG is, for example, a conductive silicon layer doped with impurity. On the back gate BG, a plurality of word electrode layers WL and a plurality of insulating layers 25 (FIG. 2) are alternately stacked. The word electrode layer WL is, for example, a conductive silicon layer doped with impurity. The insulating layer 25 is, for example, a tetraethoxysilane (TEOS) layer including silicon oxide. The number of word electrode layers WL is arbitrary.

The stacked body including the word electrode layers WL and the insulating layers 25 in the memory cell array region is divided into a plurality of blocks in the Y direction. An insulator, not shown, is buried between the blocks.

Above the uppermost word electrode layer WL in one block, a drain side select gate DSG is provided via an insulating layer, not shown. The drain side select gate DSG is, for example, a conductive silicon layer doped with impurity. Above the uppermost word electrode layer WL in another block adjacent to the former block, a source side select gate SSG is provided via an insulating layer, not shown. The source side select gate SSG is, for example, a conductive silicon layer doped with impurity. An insulating layer, not shown, is interposed between the drain side select gate DSG and the source side select gate SSG.

Above the source side select gate SSG, a source line SL is provided via an insulating layer, not shown. The source line SL is a metal layer, or, for example, a conductive silicon layer doped with impurity. A plurality of bit lines BL are provided above the source line SL and the drain side select gate DSG. Each bit line BL extends in the Y direction.

A plurality of U-shaped memory holes MH are formed in the aforementioned stacked body. In the block including the drain side select gate DSG, a hole is formed to extend in the Z direction and is punched through the drain side select gate DSG and the underlying word electrode layers WL. In the block including the source side select gate SSG, a hole is formed to extend in the Z direction and is punched through the source side select gate SSG and the underlying word electrode layers WL. These holes are connected to each other via a hole formed in the back gate BG and extending in the Y direction.

A U-shaped channel body (e.g., silicon film) 20 is provided inside the memory hole MH. A gate insulating film 35 is formed on the sidewall of the memory hole MH between the drain side select gate DSG and the channel body 20. A gate insulating film 36 is formed on the sidewall of the memory hole MH between the source side select gate SSG and the channel body 20.

A memory film 30 is formed on the sidewall of the memory hole MH between each word electrode layer WL and the channel body 20. The memory film 30 is formed also on the inner wall of the memory hole MH between the back gate BG and the channel body 20. The memory film 30 has, for example, an oxide-nitride-oxide (ONO) structure in which a silicon nitride film is sandwiched between a pair of silicon oxide films.

As shown in FIG. 2, between each word electrode layer WL and the channel body 20, a first insulating film 31, a charge storage film 32, and a second insulating film 33 are provided sequentially from the word electrode layer WL side. The first insulating film 31 is in contact with the word electrode layer WL. The second insulating film 33 is in contact with the channel body 20. The charge storage film 32 is provided between the first insulating film 31 and the second insulating film 33.

The channel body 20 functions as a channel. The word electrode layer WL functions as a control gate. The charge storage film 32 functions as a data storage layer for storing charge injected from the channel body 20. That is, at the intersection of the channel body 20 and the word electrode layer WL, a memory cell having a structure with the control gate surrounding the channel is formed.

The semiconductor memory device of this embodiment is a nonvolatile semiconductor memory device in which electrical erasure/writing of data can be freely performed and the stored content can be retained even after power off.

For example, the memory cell has a charge trap structure. The charge storage film 32 includes numerous traps for confining charges (electrons), and is, for example, a silicon nitride film. The second insulating film 33 is, for example, a silicon oxide film. The second insulating film 33 serves as a potential barrier when charge is injected from the channel body 20 into the charge storage film 32, or when the charge stored in the charge storage film 32 diffuses into the channel body 20. The first insulating film 31 is, for example, a silicon oxide film. The first insulating film 31 prevents the charge stored in the charge storage film 32 from diffusing into the word electrode layer WL.

As shown in FIG. 1, the drain side select gate DSG, the channel body 20 penetrating through the drain side select gate DSG, and the gate insulating film 35 provided between this channel body 20 and the drain side select gate DSG constitute a drain side select transistor DST. The upper end portion of the channel body 20 projected above the drain side select gate DSG is connected to the corresponding bit line BL.

The source side select gate SSG, the channel body 20 penetrating through the source side select gate SSG, and the gate insulating film 36 provided between this channel body 20 and the source side select gate SSG constitute a source side select transistor SST. The upper end portion of the channel body 20 projected above the source side select gate SSG side is connected to the source line SL.

The back gate BG, the channel body 20 provided in this back gate BG, and the memory film 30 between the back gate BG and the channel body 20 constitute a back gate transistor BGT.

A plurality of memory cells MC, as many as the number of word electrode layers WL each serving as a control gate, are provided between the drain side select transistor DST and the back gate transistor BGT.

Similarly, a plurality of memory cells MC, as many as the number of word electrode layers WL each serving as a control gate, are provided between the back gate transistor BGT and the source side select transistor SST.

These memory cells MC, the drain side select transistor DST, the back gate transistor BGT, and the source side select transistor SST are series connected to constitute one U-shaped memory string MS. The channel body 20 is formed into a U-shape, which includes a pair of pillar portions 20a extending in the stacking direction of the stacked body including a plurality of word electrode layers WL, and a connecting portion 20b buried in the back gate BG and connecting between the pair of pillar portions 20a. A plurality of U-shaped memory strings MS are arranged in the X direction and the Y direction, and thereby a plurality of memory cells MC are three-dimensionally provided in the X direction, the Y direction, and the Z direction.

In the following, the drain side select gate DSG and the source side select gate SSG are also collectively and simply referred to as a select gate SG. The drain side select transistor DST and the source side select transistor SST are also collectively and simply referred to as a select transistor ST. The bit line BL and the source line SL are also collectively and simply referred to as a wiring WR.

In the semiconductor memory device described above, the data erasing operation is an operation for extracting electrons from the charge storage film 32 (injecting holes into the charge storage film 32). The transistor constituting the memory cell MC with the word electrode layer WL serving as a control gate has a state of relatively low threshold voltage (erase state) and a state of relatively high threshold voltage (write state). The erasing operation is an operation for setting the threshold voltage of the memory cell MC to the lower state.

In general memories having two-dimensional structure, electrons written in the floating gate are extracted by increasing the substrate potential. However, in the semiconductor memory device having three-dimensional structure according to the above embodiment, the channel of the memory cell is not directly connected to the substrate. Thus, there is proposed a method for boosting the channel potential of the memory cell using the gate induced drain leakage (GIDL) current generated in the channel at the select gate end.

Specifically, first, the potential of the wiring WR is increased. Slightly later, the potential of the select gate SG is increased. Thus, a GIDL current is generated near the gate end of the select transistor ST, and holes flow into the channel body 20. On the other hand, electrons flow toward the wiring WR. Thus, the potential of the channel body 20 is increased to a potential close to that of the wiring WR. By setting the potential of the word electrode layer WL to the ground potential (0 V), a potential difference occurs between the channel body 20 and the word electrode layer WL. Hence, electrons in the charge storage film 32 are extracted, and holes are injected into the charge storage film 32. Thus, the erasing operation is performed.

To generate a GIDL current at the gate end of the select transistor ST, a diffusion layer is preferably formed at the top of the channel body 20. However, the amount of GIDL current may fluctuate due to process variations (the impurity concentration of the diffusion layer, the distance of the diffusion layer from the select transistor gate end, etc.). Thus, there is concern about variations in erase characteristics such as the erase speed and the memory cell threshold voltage after erasure.

The embodiments described below propose erasing methods independent of the GIDL current.

(First Embodiment)

Figure 4A:
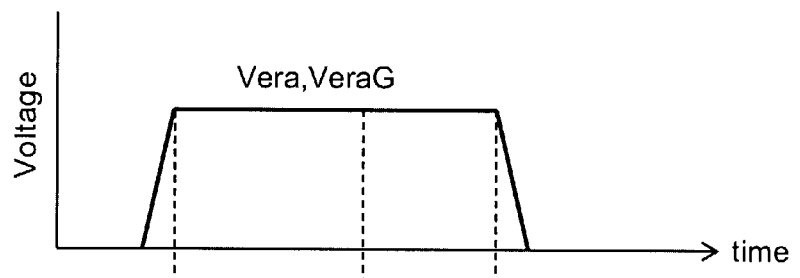
FIGS. 4A and 4B are schematic views showing a method for operating a semiconductor memory device according to a first embodiment.

FIG. 4A shows the time variation of potentials Vera and VeraG applied respectively to the wiring WR and the select gate SG in the erasing operation in a first embodiment.

Figure 4B:
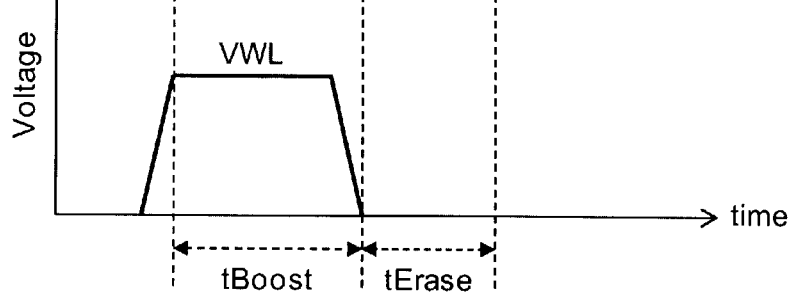

FIG. 4B shows the time variation of potential VWL applied to the word electrode layer WL in the erasing operation in the first embodiment.

This erasing operation includes a period (tBoost) for boosting the potential of the channel body 20 (hereinafter also simply referred to as a channel potential), and an erase period (tErase) for extracting electrons from the charge storage film 32 and injecting holes into the charge storage film 32 by the potential difference between the channel body 20 and the word electrode layer WL.

First, the wiring WR, the select gate SG, and the word electrode layer WL are applied with an equal first erase potential (e.g., approximately 20 V). The first erase potential turns on the select transistor ST and the transistor constituting the memory cell MC. Thus, the channel potential is boosted to a potential close to the first erase potential.

During this tBoost period, the potential of the word electrode layer WL is set to the first erase potential, equal to that of the wiring WR. This can prevent the memory cell MC from being written or erased during the tBoost period. Write or erase, if any, performed on the memory cell MC during the tBoost period causes variation in the post-erase threshold voltage set by the operation during tErase.

The back gate transistor BGT is maintained in the on-state during the tBoost and tErase period. Hence, during the tBoost and tErase period, the back gate BG is applied with a gate potential for turning on the back gate transistor BGT (e.g., the first erase potential or a potential (Vpass) lower than the first erase potential). This also applies to the other embodiments.

Continuously after boosting the channel potential, with the wiring WR and the select gate SG maintained at the first erase potential, only the potential of the word electrode layer WL is decreased to a second erase potential (e.g., ground potential) lower than the first erase potential. Hence, by the potential difference between the channel body 20 and the word electrode layer WL, electrons in the charge storage film 32 are extracted, and holes are injected into the charge storage film 32. Thus, the erasing operation is performed.

In this embodiment, no potential difference is produced between the wiring WR and the select gate SG. Hence, no GIDL current is generated at the gate end of the select transistor ST. This enables stable erasing operation immune to the variation in the amount of GIDL current.

In non-selected blocks which are not to be erased, the potential of the word electrode layer WL is placed in the floating state, so that no erasure is performed. This also applies to the other embodiments.

(Second Embodiment)

Figure 5A:
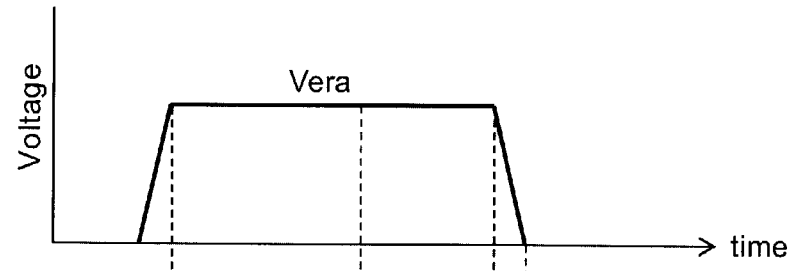
FIGS. 5A and 5B are schematic views showing a method for operating a semiconductor memory device according to a second embodiment.

FIG. 5A shows the time variation of potential Vera applied to the wiring WR in the erasing operation in a second embodiment.

Figure 5B:
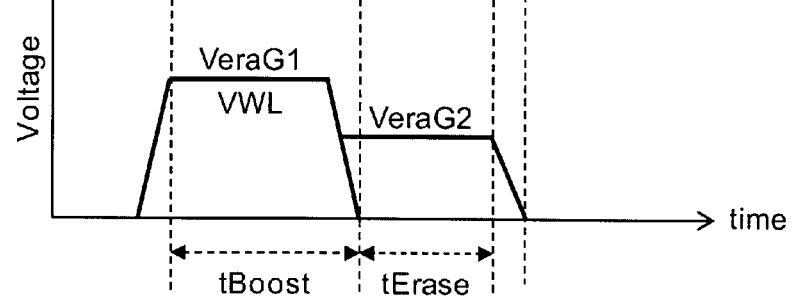

FIG. 5B shows the time variation of potential VWL applied to the word electrode layer WL and the time variation of potentials VeraG1 and VeraG2 applied to the select gate SG in the erasing operation in the second embodiment.

First, the wiring WR, the select gate SG, and the word electrode layer WL are applied with an equal first erase potential (e.g., approximately 20 V). Thus, the channel potential is boosted to a potential close to the first erase potential.

Continuously after boosting the channel potential, with the wiring WR maintained at the first erase potential, the potential of the word electrode layer WL is decreased to a second erase potential (e.g., ground potential) lower than the first erase potential. Hence, by the potential difference between the channel body 20 and the word electrode layer WL, electrons in the charge storage film 32 are extracted, and holes are injected into the charge storage film 32. Thus, the erasing operation is performed. This embodiment also enables stable erasing operation independent of the GIDL current.

Furthermore, in this embodiment, the select gate SG is first applied with VeraG1, equal to the first erase potential. Subsequently, during the tErase period, the select gate SG is applied with a third erase potential VeraG2 lower than VeraG1. Both VeraG1 and VeraG2 turn on the select transistor ST.

The potential difference between the potential Vera of the wiring WR and the potential VeraG2 of the select gate SG generates a small amount of GIDL current. This compensates for the decrease of the boosted channel potential. Thus, during the tErase period, the potential difference between the channel body 20 and the word electrode layer WL is stably retained. This enables erasing to a desired threshold.

The GIDL current in this case is as small as compensating for the decrease of the channel potential already boosted. Furthermore, application of VeraG2 lower than the first erase potential is not continued throughout the period in which the wiring WR is applied with the first erase potential. Hence, as compared with the case where the channel potential is boosted by using only the GIDL current, the influence of the GIDL current on the erase characteristics can be suppressed. Thus, the potential difference between Vera and VeraG2 can be set smaller than that in the case where the channel potential is boosted by using only the GIDL current.

(Third Embodiment)

Figure 6A:
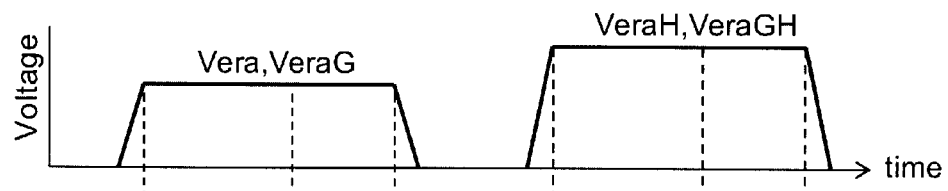
FIGS. 6A and 6B are schematic views showing a method for operating a semiconductor memory device according to a third embodiment.

FIG. 6A shows the time variation of potentials Vera and VeraG applied respectively to the wiring WR and the select gate SG in the erasing operation in a third embodiment.

Figure 6B:
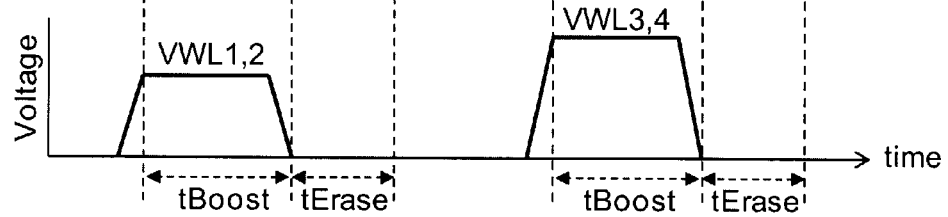

FIG. 6B shows the time variation of the potential applied to the word electrode layer WL in the erasing operation in the third embodiment.

In this embodiment, a model with four word electrode layers WL, for example, is considered. In FIG. 6B, VWL1, VWL2, VWL3, and VWL4 represent the potential of the first, second, third, and fourth lowest word electrode layers WL, respectively.

First, the wiring WR, the select gate SG, and the first and second word electrode layers WL are applied with an equal first erase potential (e.g., approximately 20 V) to boost the channel potential. The third and fourth word electrode layers WL are placed in the floating state.

Continuously after boosting the channel potential, with the wiring WR and the select gate SG maintained at the first erase potential, only the potential of the first and second word electrode layers WL is decreased to a second erase potential (e.g., ground potential) lower than the first erase potential. Hence, by the potential difference between the channel body 20 and the first and second word electrode layers WL, electrons in the charge storage film 32 of the memory cells with these word electrode layers WL serving as control gates are extracted, and holes are injected into the charge storage film 32. Thus, the erasing operation is performed. At this time, the third and fourth word electrode layers WL are placed in the floating state. Thus, the erasing operation is not performed on the memory cells with these word electrode layers WL serving as control gates.

Next, the wiring WR is applied with potential VeraH higher than Vera applied in the previous phase. The select gate SG is applied with potential VeraGH higher than VeraG applied in the previous phase. VeraH and VeraGH are equal. Thus, the channel potential is boosted. Furthermore, the third and fourth word electrode layers WL are also applied with the same potential (VeraH=VeraGH) as the wiring WR and the select gate SG. This can prevent the memory cell MC from being written or erased during the tBoost period. The first and second word electrode layers WL are placed in the floating state.

Continuously, with the wiring WR and the select gate SG maintained at VeraH (=VeraGH), only the potential of the third and fourth word electrode layers WL is decreased to the second erase potential (e.g., ground potential). Hence, by the potential difference between the channel body 20 and the third and fourth word electrode layers WL, electrons in the charge storage film 32 of the memory cells with these word electrode layers WL serving as control gates are extracted, and holes are injected into the charge storage film 32. Thus, the erasing operation is performed. At this time, the first and second word electrode layers WL are placed in the floating state. Thus, the erasing operation is not performed on the memory cells with these word electrode layers WL serving as control gates.

Also in this embodiment, at the time of the erasing operation, no potential difference is produced between the wiring WR and the select gate SG. Hence, no GIDL current is generated at the gate end of the select transistor ST. This enables stable erasing operation immune to the variation in the amount of GIDL current.

In the semiconductor memory device according to this embodiment, after forming a stacked body including a plurality of word electrode layers WL, memory holes collectively punched through the plurality of word electrode layers WL are formed by, for example, the reactive ion etching (RIE) method. Then, a memory film 30 and a channel body 20 are formed in the memory hole. Thus, the cost can be reduced. In such a case, if the number of stacked word electrode layers WL is increased particularly for higher capacity, the aspect ratio (the ratio of the depth to the hole diameter) of the collectively formed memory hole increases. This makes the hole diameter more likely to vary between the upper layer side and the lower layer side in the memory hole.

In the hole formed by the RIE method, the hole diameter tends to be larger on the upper layer side than on the lower layer side. Hence, under application of the same erase voltage, the electric field applied to the memory film 30 on the relatively upper layer side tends to be lower than that on the lower layer side. Thus, the progress of erasure is slower on the upper layer side.

In this embodiment, the upper layer side and the lower layer side are selectively erased in separate phases. Furthermore, in the erasing operation on the upper layer side, the wiring WR and the select gate SG are applied with a higher potential than in the erasing operation on the lower layer side. Hence, the potential difference between the channel body 20 and the word electrode layer WL to be erased during tErase on the upper layer side is made higher than that during tErase on the lower layer side. Thus, within the same erase time as that on the lower layer side, erasure on the upper layer side can also be advanced to a similar degree to that on the lower layer side. Consequently, even if the hole diameter of the memory hole varies between the upper layer side and the lower layer side, the variation in the post-erase threshold voltage between the upper layer side and the lower layer side can be suppressed.

The embodiments are not limited to previously performing erasure on the lower layer side and subsequently performing erasure on the upper layer side. It is also possible to previously perform erasure on the upper layer side and subsequently perform erasure on the lower layer side. Furthermore, the embodiments are not limited to selective erasure with the four word electrode layers WL divided into two upper layers and two lower layers. Selective erasure may be performed separately on one upper layer and three lower layers, or three upper layers and one lower layer. Naturally, the number of word electrode layers WL is also not limited to four. That is, the first erase potential applied to the wiring WR and the select gate SG is made higher during tErase on relatively upper word electrode layers WL of the plurality of word electrode layers WL than during tErase on relatively lower word electrode layers WL.

(Fourth Embodiment)

Figure 7A:
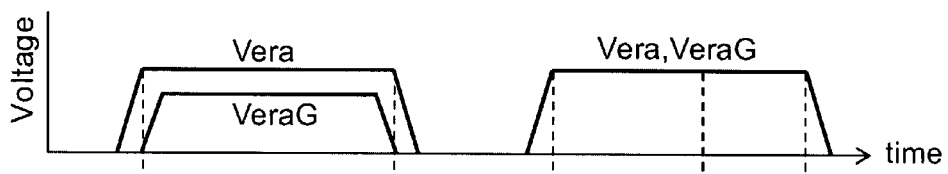
FIGS. 7A and 7B are schematic views showing a method for operating a semiconductor memory device according to a fourth embodiment.

FIG. 7A shows the time variation of potentials Vera and VeraG applied respectively to the wiring WR and the select gate SG in the erasing operation in a fourth embodiment.

Figure 7B:
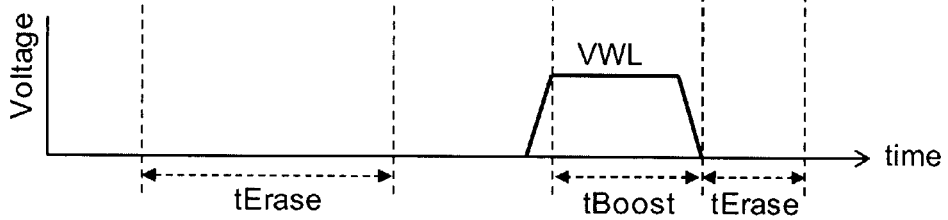

FIG. 7B shows the time variation of potential VWL applied to the word electrode layer WL in the erasing operation in the fourth embodiment.

In this embodiment, the aforementioned erasing operation (first erasing operation) for boosting the channel potential without using the GIDL current is combined with an erasing operation (second erasing operation) for boosting the channel potential using the GIDL current. Here, in FIGS. 7A and 7B, the second erasing operation is previously performed, and the first erasing operation is subsequently performed. However, it is also possible to previously perform the first erasing operation and subsequently perform second erasing operation.

First, the second erasing operation is performed. During this second erasing operation, the potential of the word electrode layer WL is maintained at the ground potential. Furthermore, the potential of the back gate BG is maintained at a potential turning on the back gate transistor BGT.

The potential of the wiring WR is increased to a first erase potential (e.g., 20 V). Slightly later, the potential of the select gate SG is increased to a potential (e.g., 15 V) lower than the first erase potential. Thus, a GIDL current is generated near the gate end of the select transistor ST, and holes flow into the channel body 20. On the other hand, electrons flow toward the wiring WR. Thus, the potential of the channel body 20 is increased to a potential close to that of the wiring WR. By setting the potential of the word electrode layer WL to the ground potential, a potential difference occurs between the channel body 20 and the word electrode layer WL. Hence, electrons in the charge storage film 32 are extracted, and holes are injected into the charge storage film 32. Thus, the second erasing operation is performed.

Subsequently, the first erasing operation is performed. More specifically, the wiring WR, the select gate SG, and the word electrode layer WL are applied with a first erase potential (e.g., 20 V). Thus, the channel potential is boosted to a potential close to the first erase potential. Then, continuously, with the wiring WR and the select gate SG maintained at the first erase potential, only the potential of the word electrode layer WL is decreased to a second erase potential (e.g., ground potential) lower than the first erase potential. Hence, by the potential difference between the channel body 20 and the word electrode layer WL, electrons in the charge storage film 32 are extracted, and holes are injected into the charge storage film 32. Thus, the erasing operation is performed.

The second erasing operation using the GIDL current has a faster erase speed than the first erasing operation, and can serve to reduce the erase time. The first erasing operation produces no potential difference between the wiring WR and the select gate SG. Hence, no GIDL current is generated at the gate end of the select transistor ST. This enables stable erasing operation immune to the variation in the amount of GIDL current.

For example, in the second erasing operation, the voltage is set higher (shallow erase state) than a target threshold voltage. Subsequently, in the first erasing operation, the voltage is set to the target threshold voltage. Thus, a stable erase state can be achieved within a short time.

Furthermore, of a plurality of word electrode layers WL, relatively lower word electrode layers WL are selectively subjected to the first erase operation, and relatively upper word electrode layers WL are selectively subjected to the second erase operation. This can accelerate erasure on the upper layer side where the hole diameter of the memory hole is relatively large and the erase speed tends to be slower than on the lower layer side. Consequently, even if the hole diameter of the memory hole varies between the upper layer side and the lower layer side, the variation in the post-erase threshold voltage between the upper layer side and the lower layer side can be suppressed.

(Fifth Embodiment)

Figure 8A:
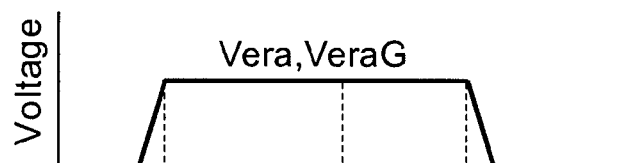
FIGS. 8A to 8E are schematic views showing a method for operating a semiconductor memory device according to a fifth embodiment.
Figure 8B:
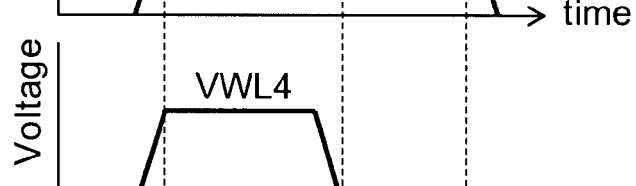
Figure 8C:
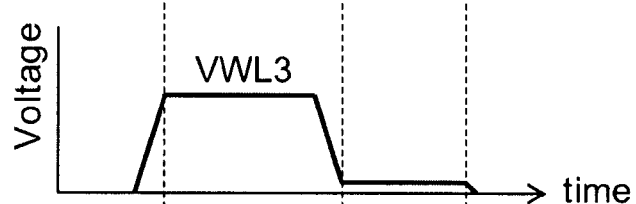
Figure 8D:
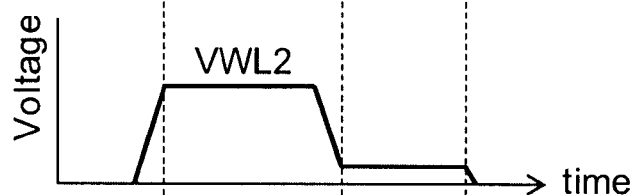
Figure 8E:
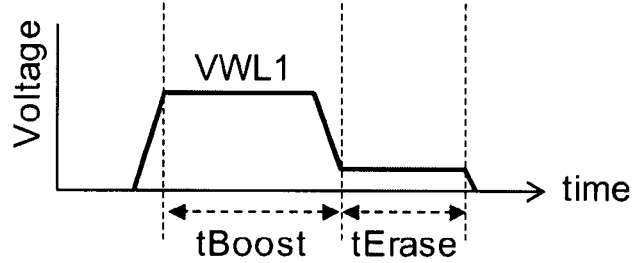

FIG. 8A shows the time variation of potentials Vera and VeraG applied respectively to the wiring WR and the select gate SG in the erasing operation in a fifth embodiment.

FIGS. 8B to 8E show the time variation of the potential applied to each word electrode layer WL in the erasing operation in the fifth embodiment.

In this embodiment, a model with four word electrode layers WL, for example, is considered. In FIGS. 8B to 8E, VWL1, VWL2, VWL3, and VWL4 represent the potential of the first, second, third, and fourth lowest word electrode layers WL, respectively.

In this embodiment, during the tErase period, the potential of the relatively upper word electrode layer WL is set lower than the potential of the lower word electrode layer WL. For example, during the tErase period, the potential applied to each word electrode layer WL is set so that the potential gradually increases from the upper layer to the lower layer.

First, the wiring WR, the select gate SG, and each word electrode layer WL are applied with a first erase potential (e.g., 20 V). Thus, the channel potential is boosted close to the first erase potential. Then, with the wiring WR and the select gate SG maintained at the first erase potential, the uppermost (fourth lowest) word electrode layer WL is set to, for example, the ground potential (0 V). The third lowest word electrode layer WL is set to, for example, 1 V. The second lowest word electrode layer WL is set to, for example, 2 V. The lowermost (first lowest) word electrode layer WL is set to, for example, 3 V.

The potential applied to each word electrode layer WL during tErase is lower than the potential applied to the wiring WR and the select gate SG during tErase. Hence, by the potential difference between the channel body 20 and each word electrode layer WL, electrons in the charge storage film 32 of the memory cells with each word electrode layer WL serving as a control gate are extracted, and holes are injected into the charge storage film 32. Thus, the erasing operation is performed. This enables stable erasing operation immune to the variation in the amount of GIDL current.

Furthermore, during tErase, the relatively upper word electrode layer WL is applied with a lower potential. That is, during tErase, the relatively upper word electrode layer WL has a larger potential difference from the channel body 20. Consequently, even if the hole diameter of the memory hole on the upper layer side is relatively larger, the decrease of the erase speed on the upper layer side can be compensated, and the variation in the post-erase threshold voltage between the upper layer side and the lower layer side can be suppressed. Furthermore, in this embodiment, the threshold adjustment can be collectively performed on each layer in one tErase phase.

The number of word electrode layers WL is not limited to four. Furthermore, the embodiment is not limited to gradual change of the potential on a layer-by-layer basis. That is, during tErase, the potential of the relatively upper word electrode layers is set lower than the potential of the lower word electrode layers. However, the potential applied to each word electrode layer WL during tErase is made lower than Vera and VeraG.

Figure 9:
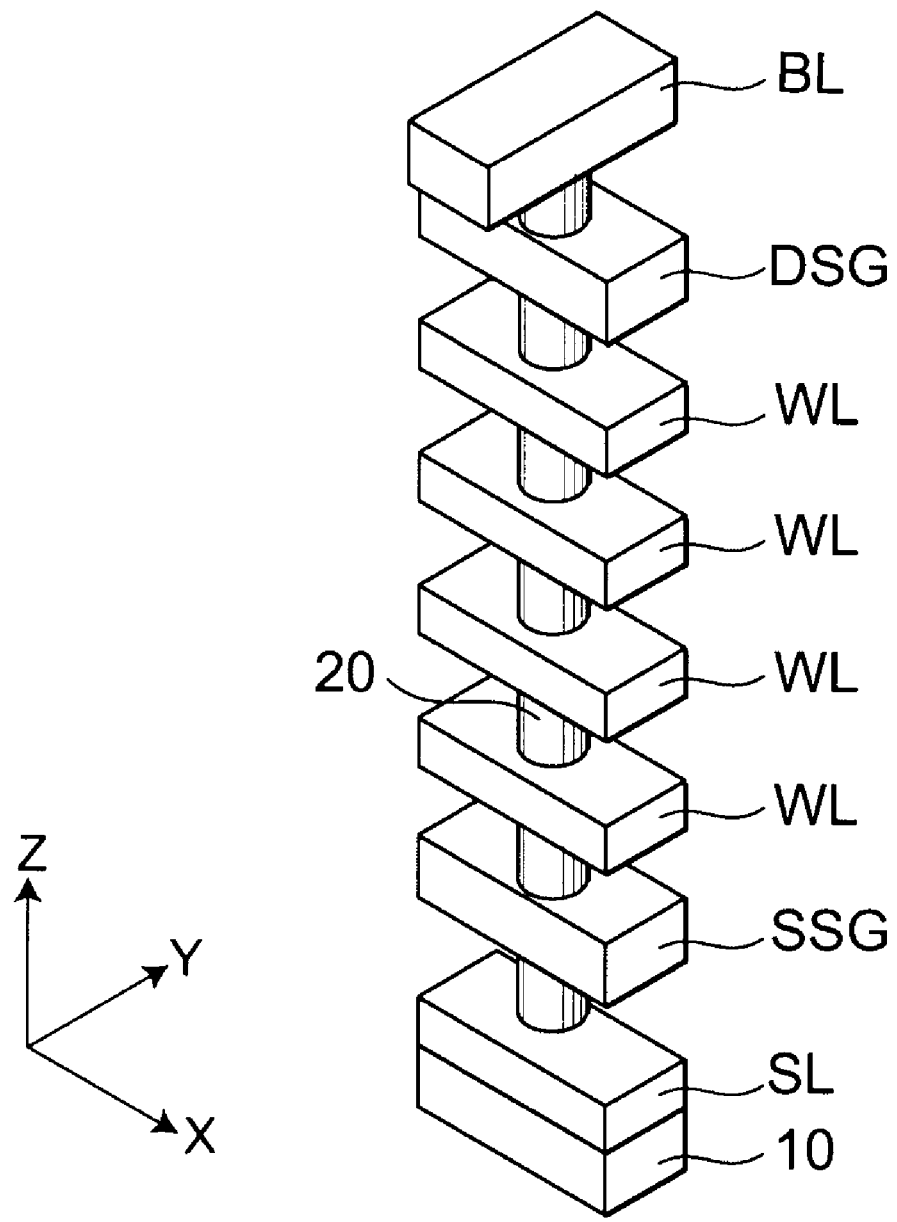
FIG. 9 is a schematic perspective view showing another specific example of the memory string in the semiconductor memory device of the embodiment.

The configuration of the memory string is not limited to the U-shape, but may be an I-shape as shown in FIG. 9. FIG. 9 shows only the conductive portions, and omits the insulating portions. In this structure, a source line SL is provided on a substrate 10. A source side select gate (or lower select gate) SSG is provided on the source line SL. A plurality of word electrode layers WL are provided on the source side select gate SSG. A drain side select gate (or upper select gate) DSG is provided between the uppermost word electrode layer WL and a bit line BL. The erasing method of the above embodiments is also applicable to this memory string.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for operating a semiconductor memory device, the semiconductor memory device including:
   a substrate;

a stacked body including a plurality of word electrode layers and a plurality of insulating layers alternately stacked on the substrate;

a memory film including a charge storage film provided on an inner wall of a memory hole punched through the stacked body;

a channel body provided inside the memory film in the memory hole;

a select transistor including a select gate stacked on the stacked body and connected to an end portion of the channel body; and a wiring connected to the select transistor, the method comprising:

boosting a potential of the channel body by applying a first erase potential to the wiring, the select gate, and the word electrode layer; and after the boosting of the potential of the channel body, with the wiring and the select gate maintained at the first erase potential, decreasing a potential of the word electrode layer to a second erase potential lower than the first erase potential.

2. The method according to claim 1, wherein a relatively upper layer side of the plurality of word electrode layers and a relatively lower layer side of the plurality of word electrode layers are divided in separate phases and selectively erased.

3. The method according to claim 2, wherein the first erase potential applied to the wiring and the select gate is made higher when applying the second erase potential to relatively upper word electrode layers of the plurality of word electrode layers than when applying the second erase potential to relatively lower word electrode layers of the plurality of word electrode layers.

4. The method according to claim 3, wherein the upper word electrode layers are made floating when the lower word electrode layers are applied with the first erase potential and the second erase potential, and the lower word electrode layers are made floating when the upper word electrode layers are applied with the second erase potential and a potential higher than the first erase potential applied to the lower word electrode layers.

5. The method according to claim 1, wherein before a first erasing operation based on the first erase potential and the second erase potential, a second erasing operation is performed in which a gate induced drain leakage (GIDL) current is generated in the channel body by setting the word electrode layer to a ground potential and generating a potential difference between the wiring and the select gate.

6. The method according to claim 5, wherein in the second erasing operation, a threshold voltage of a memory cell with the word electrode layer serving as a control gate is set higher than a target value, and in the first erasing operation, the threshold voltage of the memory cell is set to the target value.

7. The method according to claim 5, wherein the first erasing operation is performed on relatively lower word electrode layers of the plurality of word electrode layers, and the second erasing operation is performed on relatively upper word electrode layers of the word electrode layers.

8. The method according to claim 1, wherein after a first erasing operation based on the first erase potential and the second erase potential, a second erasing operation is performed in which a gate induced drain leakage (GIDL) current is generated in the channel body by setting the word electrode layer to a ground potential and generating a potential difference between the wiring and the select gate.

9. The method according to claim 8, wherein the first erasing operation is performed on relatively lower word electrode layers of the plurality of word electrode layers, and the second erasing operation is performed on relatively upper word electrode layers of the word electrode layers.

10. The method according to claim 1, wherein the second erase potential is a ground potential.

11. The method according to claim 1, wherein the first erase potential turns on the select transistor.

12. A method for operating a semiconductor memory device, the semiconductor memory device including:

a substrate;

a stacked body including a plurality of word electrode layers and a plurality of insulating layers alternately stacked on the substrate;

a memory film including a charge storage film provided on an inner wall of a memory hole punched through the stacked body;

a channel body provided inside the memory film in the memory hole;

a select transistor including a select gate stacked on the stacked body and connected to an end portion of the channel body; and a wiring connected to the select transistor, the method comprising:

boosting a potential of the channel body by applying a first erase potential to the wiring, the select gate, and the word electrode layer; and after the boosting of the potential of the channel body, with the wiring maintained at the first erase potential, decreasing a potential of the word electrode layer to a second erase potential lower than the first erase potential, and setting a potential of the select gate to a third erase potential lower than the first erase potential and higher than the second erase potential.

13. The method according to claim 12, wherein the second erase potential is a ground potential.

14. The method according to claim 12, wherein the first erase potential turns on the select transistor.

15. The method according to claim 12, wherein the third erase potential turns on the select transistor.

16. A method for operating a semiconductor memory device, the semiconductor memory device including:

a substrate;

a stacked body including a plurality of word electrode layers and a plurality of insulating layers alternately stacked on the substrate;

a memory film including a charge storage film provided on an inner wall of a memory hole punched through the stacked body;

a channel body provided inside the memory film in the memory hole;

a select transistor including a select gate stacked on the stacked body and connected to an end portion of the channel body; and a wiring connected to the select transistor, the method comprising:

boosting a potential of the channel body by applying a first erase potential to the wiring, the select gate, and the word electrode layer; and after the boosting of the potential of the channel body, with the wiring and the select gate maintained at the first erase potential, setting a potential of the word electrode layer to a potential lower than the first erase potential and setting a potential of a relatively upper word electrode layer of the word electrode layers is made lower than a potential of a lower word electrode layer of the word electrode layers.

17. The method according to claim 16, wherein after the boosting of the potential of the channel body, the potential of each of the word electrode layers is set to a potential lower than the first erase potential in a same period.

18. The method according to claim 16, wherein the first erase potential turns on the select transistor.

* * * * *